United States Patent [19]

Mastellone

[11] Patent Number: 4,831,543
[45] Date of Patent: May 16, 1989

[54] HIERARCHICAL NET LIST DERIVATION SYSTEM

[75] Inventor: Mitchel A. Mastellone, New Brunswick, N.J.

[73] Assignee: Harris Semiconductor (Patents) Inc., Melbourne, Fla.

[21] Appl. No.: 831,990

[22] Filed: Feb. 21, 1986

[51] Int. Cl.$^4$ .............................................. G06F 15/60
[52] U.S. Cl. ..................................... 364/489; 364/490
[58] Field of Search ............... 364/300, 488, 489, 490, 364/491, 513, 200, 900

[56] References Cited

U.S. PATENT DOCUMENTS 4,651,284 3/1987 Watanabe et al. .................. 364/491

OTHER PUBLICATIONS

Frederick Hayes-Roth, "The Knowledge-Based Expert System: A Tutorial", 9/84.
Hartzband et al., "Enhancing Knowledge Representation in Engineering Databases", 9/85.
Yoshiura et al., "Top-Down Construction of 3-D Mechanical Object Shapes from Engineering Drawings", 12/84, pp. 32-39.
Abadir et al., "A Knowledge-Based System for Designing Testable VLSI Chips", 8/85.
RCA Manual AGL-132, entitled "Gate Array PA500-00-Series CMOS Cell Library," dated 9-85.
RCA Manual MDK-101, entitled "PA50000 CMOS Gate Arrays-Mentor Graphics Design Tool Kit," dated 12-85.
RCA Manual DDK-111, entitled "PA50000 CMOS Gate Arrays-Daisy Engineering Design Tool Kit," dated 12-85.
RCA Manual MIM-155, entitled "A Comprehensive Logic Network Simulator-MIMIC," dated 1-86.
RCA Manual 2M1339B, entitled "RCA CMOS Semicustom LSI-LSI Circuit Design Made Easy", dated 1985.
Horowitz and Sahni, *Fundamentals of Data Structures*, Computer Science Press, Inc., Maryland, 1983, Chap. 4, "Linked Lists," pp. 106-111, and Chap. 5, Trees, pp. 218-277.

*Primary Examiner*—Parshotam S. Lall
*Assistant Examiner*—Ellis B. Ramirez
*Attorney, Agent, or Firm*—Henry Schanzer

[57] ABSTRACT

A binary tree is created from flat part list and synonym output files and a component library. Each tree record includes a part, type, full path name, and net functional description for each primary net of each block and for each component in that block. The hierarchical coupling of these records and the primary net descriptions in each record supply all of the information necessary to extract a hierarchical net list.

17 Claims, 7 Drawing Sheets

HIERARCHICAL NET LIST DERIVATION SYSTEM

BACKGROUND OF THE INVENTION

This invention relates to a computer operated system for designing integrated circuits and specifically systems which derive a hierarchical interconnection net list from an integrated circuit data base and provide net functional descriptions for all hierarchical blocks and components in the circuit.

A circuit designer initially creates a logic circuit, which may include hundreds of different logic components, and which is later fabricated into a microelectronic chip (IC). To manufacture an integrated circuit chip requires the circuit schematic diagram be transformed into a format for producing, by computer controlled processes, a silicon wafer containing metallization patterns which form the circuit's logic elements. Such transformation includes the use of a computer aided design (CAD) workstation having a plurality of component libraries, each library defining a family of components of given properties, e.g., delay times, fabrication technology, and so on.

A component library includes a list of all components that are available to a designer. The components in each library are identified by the generic description of the component type. For example, the term "NAND" for a NAND gate is its type description and distinguishes this component from others such as OR gates, flip-flops, and so on. A two-input NAND gate might be a type 2NAND. When a particular 2NAND component is placed in a given circuit design, it is given an instance name, to distinguish it from all other 2NAND gates in the circuit.

A group of components which perform a given function, i.e., a block, and blocks which are closely electrically related, should be placed as close as possible to one another to conserve wafer real estate and simplify conductor routing. The placement of components and the routing of the conductors is done by computer software at a later stage in the wafer fabrication process. Once an initial block of components is created, the CAD workstation can be used to duplicate such blocks which are then interconnected by the designer on the workstation display to form more complex circuits. A block in a given circuit level may be subdivided into a plurality of subordinate functional blocks. The subordinate blocks may be further subdivided into other more subordinate blocks and so on until the circuit's most primitive subordinate level is represented by components. In practice, the designer may start with components and build the circuit from the components or start from the most general block diagram and work down toward the component level. Blocks are given a type designation and an instance name when they are created.

The term "part" as used herein refers to either a subordinate block or a component. The most superior block in the circuit is referred to as a "top" and every other block is subordinate to it. The arrangement of a circuit by block diagram at different levels is referred to as a hierarchy and the hierarchy is important for transferring the circuit design onto a silicon wafer because it identifies the most immediate next of kin of a given block. The next of kin identification is used by subsequent operations for placement and routing and test purposes.

The creation of the circuit on the workstation display, known as "schematic capture," also includes naming the interconnecting wires of the different blocks and components. These interconnecting wires are referred to as "nets." Nets, whether at the block or component level, are designated by functional description and name. The functional description indicates whether a net is an input, an output, or bidirectional with respect to the component it is attached to. During schematic capture, the complete functional block layout of a given circuit at each level is entered on the workstation including the part names and type, and the net names. However, net functional descriptions are available only relative to components and only from the component libraries and are not designated by such a description in the schematic capture circuit layout.

After entering a circuit design on the workstation, certain other processes are required to create the silicon wafer fabrication data. One such process employs a logic simulator which simulates, for a given logic circuit and a given logic input, the resultant logic output. This simulation is an essential step needed to verify the accuracy of the logic design. This process, however, needs to know all block functions and their net functional descriptions. Another process is one employed for placing the components on the silicon wafer in a given layout and for routing the conductors among the components on the wafer. This latter process needs to know which blocks are adjacent in hierarchy order to optimize the layout and routing.

However, a problem arises in the use of certain CAD workstations with certain logic simulators and placement and routing computer programs. Certain of such simulation software and placement and routing programs requires a hierarchical net list describing a given circuit design. A hierarchical net list, shown in TABLE II herein, is a list of all blocks and components, their names and types, and the names and functional descriptions of their primary nets in hierarchical order. Starting with the top block, the hierarchical net list includes the instance names for each subordinate block, its type and the components, if any, connected to its subordinate blocks, and the names and the functional descriptions of all primary nets for each block.

Some CAD workstations automatically create such hierarchical net lists from the schematic capture stage. However, not all commercially available CAD workstations implement such hierarchical net lists. Those systems manufacturers who have workstations which do not have the capability for generating hierarchical net lists cannot as easily use their circuit designs already created on their CAD workstations for IC manufacture and must repeat the design transfer process to a workstation with hierarchical net list capability or manually enter a hierarchical net list. This is costly and cumbersome.

SUMMARY OF THE INVENTION

The present inventor recognized that some CAD workstations create a data base of circuit information from which a flat part description file, TABLE IA herein, and synonym file, TABLE IB, can be extracted. A flat part description includes the full path names of all components and a list of their nets. The full path name of a component includes the names of the blocks of a given hierarchy in which each component appears. Net functional descriptions of the nets of the blocks and components are not set forth. A synonym file includes synonyms for primary and local nets. For example, in many cases the same nets at different levels of the hierarchy may be assigned different instance names. The synonym file, lists the blocks, their nets and their synonyms. The synonym file also contains the full path names of all blocks. A full path name of a block is a description which sets forth all block names for each block through a hierarchy from the top block through each subordinate block to that block. Net functional descriptions are not included and, without more, the flat part description and synonym files are not directly useable for the aforementioned logic simulator and placement and routing software.

The present inventor, recognized that important information relative to a hierarchical net list, missing from the flat part description file and synonym file, namely, which nets to each component are input, output, or bidirectional, is present in the component library files. According to the present invention, the hierarchical order of all blocks of a circuit and the net fumnctional description for all primary nets of each block can be derived from the flat part description, synonym, and library files from which derivation a hierarchical net list for a given circuit can be generated.

More particularly, a system according to the present invention derives a hierarchical net list from a data base comprising an output flat part description file of an integrated circuit including the full path name of each component in the circuit, an output synonym file containing the names of the primary and local nets of each block for all nets in the circuit and the full path name of each block in the circuit and from a component library containing the functional description of all component nets. The system includes means for deriving from the output files and library a plurality of records each at a given unique address in a computer memory. Each record contains information including the name of a different block, its type, its full path name describing its place in a given hierarchy of that circuit, the name of its primary nets, the names and types of its components, if any, and the functional description of each component net. Means derive from the full path name of each block the hierarchical coupling of that block record to its next of kin in the hierarchy and for assigning each record a memory address pointer pointing to selected ones of the next of kin. Means are included for providing the net functional description of all primary nets in each record to thereby provide records from which a hierarchical net description for each block and part in the circuit can be derived.

BRIEF DESCRIPTION OF THE DRAWING

In the drawing:

FIGS. 2b-2f are schematic diagrams showing different hierarchical levels of several of the elements of the circuit of FIG. 2a wherein:

FIG. 2b is the TOP block diagram of the circuit of FIG. 2a;

FIG. 2c is a block diagram of a type X part of FIG. 2b;

FIG. 2d is a logic diagram of a type XX part of FIGS. 2c and 2e;

FIG. 2e is a block diagram of the type Y part of the diagram of FIG. 2b; and

FIG. 2f is a logic diagram of type YY component of the diagram of FIG. 2e;

DETAILED DESCRIPTION OF THE DRAWING

Figure 1:
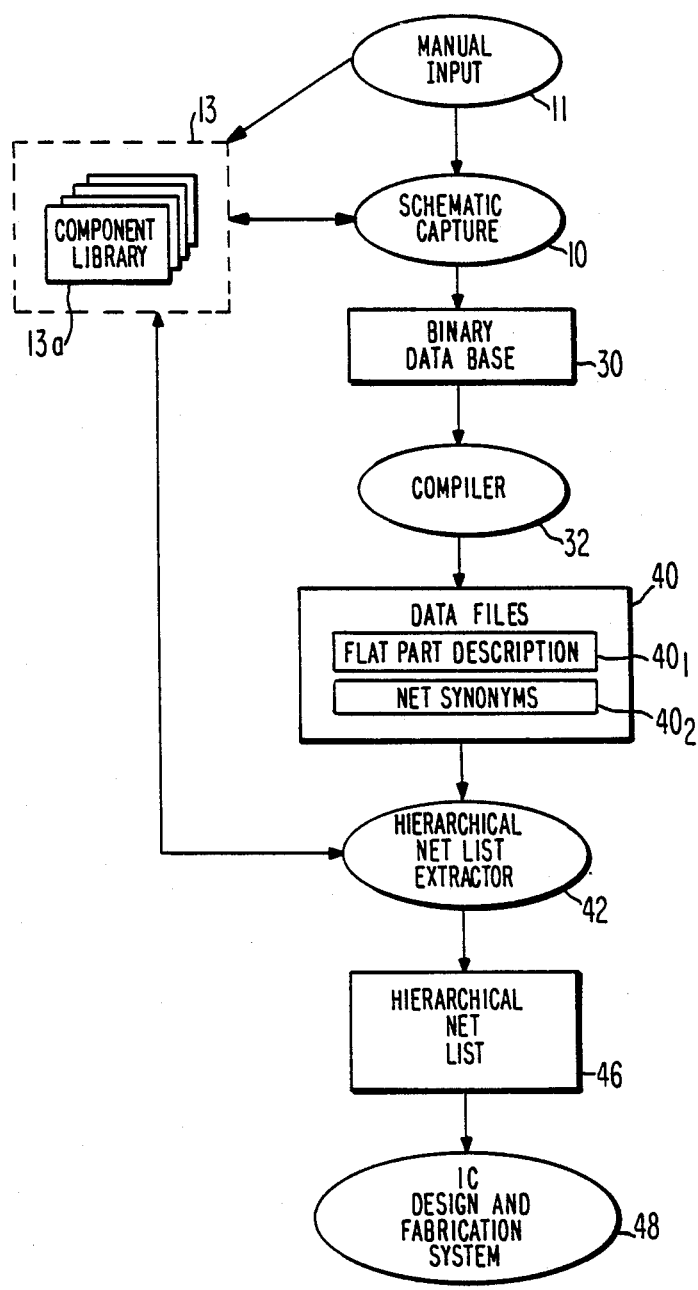
FIG. 1 is a schematic flowchart illustrating data processing methodology and structure in accordance with one embodiment of the present invention for deriving a hierarchical part net list.
Figure 2A:
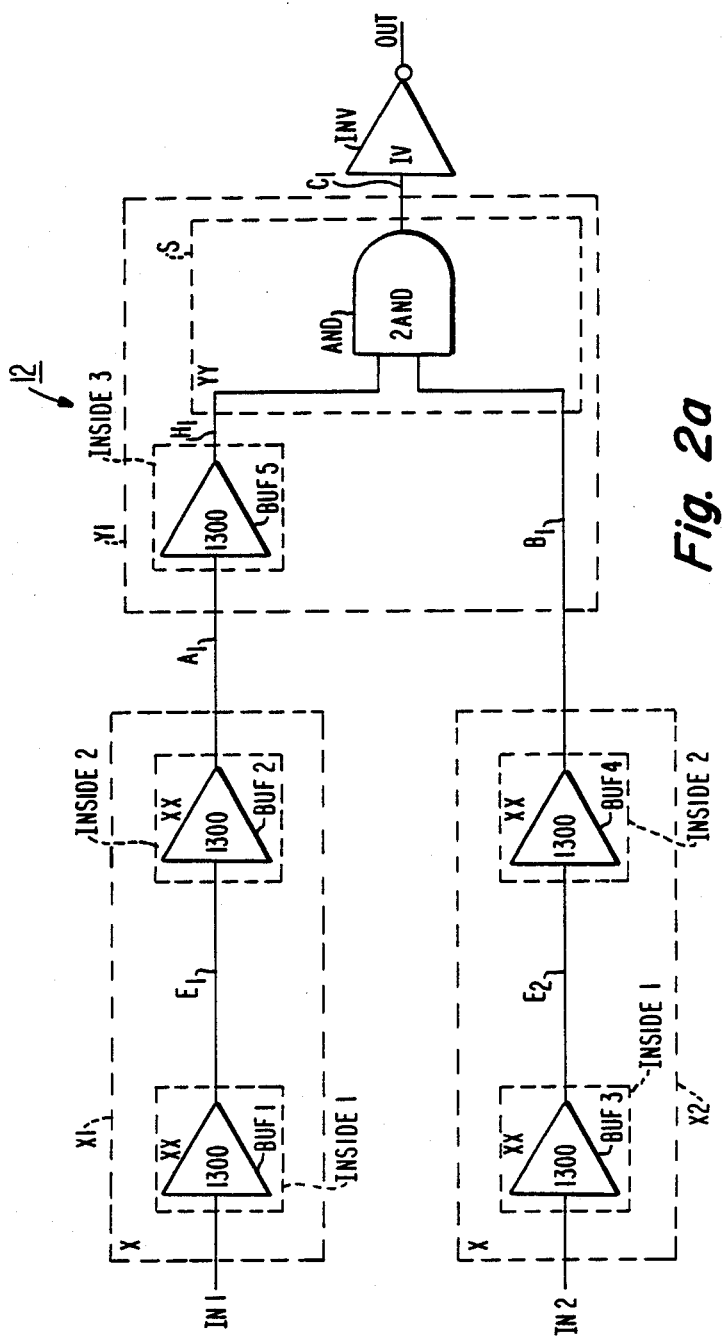
FIG. 2a is a schematic circuit diagram of a simplified circuit employed for purposes of illustration.

In FIG. 1, items in oval are processes implemented, for example, by a computer program and items in rectangles are data. In schematic capture 10 an operator inputs via manual input 11 a given logic circuit design onto a terminal display and into the memory of a CAD workstation usually starting from the top block. One such workstation is commercially available from the Valid Logic Corporation. Schematic capture was described briefly in the introductory portion. The schematic capture step 10 comprises drawing a circuit, such as circuit 30, FIG. 2b, on the workstation display via input 11 employing a computer keyboard and a mouse. The circuit 30 represents circuit 12, FIG. 2a. The component descriptions of FIG. 2a are contained in a set of libraries 13, each library on a tape or disk. The operator selects one library, e.g., library 13a, for his circuit design.

Figure 2B:
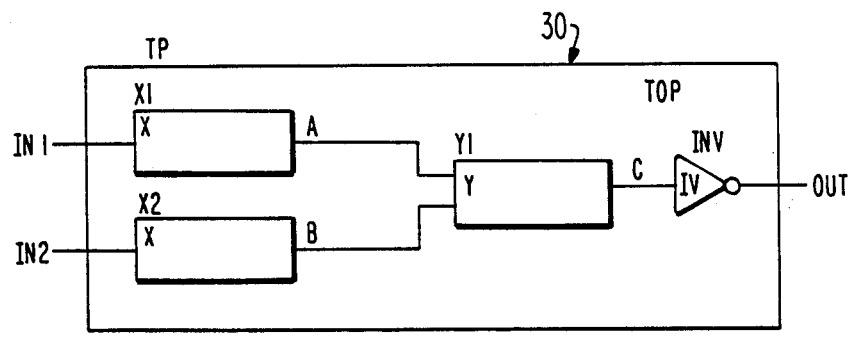

The circuit 12 of FIG. 2a or circuit 30 of FIG. 2b, FIG. 2b, is a simplified diagram employed for purposes of illustration. It should be understood that significantly more complex circuits of a typical logic diagram are employed in an actual integrated circuit, i.e., FIG. 2d circuit typically contains 10-15 gates (components). It is also to be understood that while the principles involved in creating a hierarchical net list from the schematic circuit of FIG. 2a are as outlined herein, such a system for deriving the hierarchical net list is equally applicable to the more complex logic circuits employed in actual digital integrated circuit designs involving hundreds and thousands of components.

Circuit 12, FIG. 2a, comprises serially connected type 1300 buffers BUF1, BUF2, and BUF5 which couple input net IN1 to input net $H_1$ of a type 2AND gate (AND) via nets $E_1$ and $A_1$. A second set of serially coupled type 1300 buffers BUF3 and BUF4 couple input net IN2 as a second input $B_1$ to the 2AND gate (AND) via net $E_2$. The names of components, e.g., BUF1, BUF2, etc., and the nets $E_1$, $E_2$, $A_1$, $B_1$, $H_1$, and $C_1$ are not used in a hierarchical net list and are given only for purposes of illustration. The output net $C_1$ of the AND gate is an input to a type IV inverter INV whose output net OUT is the circuit 12 output. The above description is for purpose of illustration and does not appear during schematic capture.

The schematic capture 10 process forms the circuit 12 into block diagrams on the workstation display. In FIG. 2b, a block named TP is created in the display, is of type "TOP" and represents the schematic circuit 12, FIG. 2a, in block diagram form. Block TP is given input nets IN1, IN2, and an output net OUT. The circuit 12 is divided into arbitrarily assigned blocks for purposes of illustration.

The circuit 30, part TP, FIG. 2b, comprises a set of parts which includes both blocks and a component. Circuit 30 includes block part XI type X, which represents buffers BUF1 and BUF2, having an input net IN1 and an output net A coupled as one input to block part Y1, type Y, which represents the combination of buffer BUF5 and the 2AND gate (AND), FIG. 2a. A second type X block, part X2, is drawn on the display and has an input net IN2 and an output net B coupled as a second input to a type Y block. Block part X2 represents BUF3 and BUF4, FIG. 2a. To distinguish between the two type X blocks, the type X block representing BUF1 and BUF2 is named X1 on the display and the type X block representing BUF3 and BUF4 is named X2. Block Y, named Y1, is a type Y. Part Y1 has an output net C. For purpose of illustration, the component type IV, named INV, is called up from the library 13a, FIG. 1, and is left as a component in the block diagram of FIG. 2b to illustrate the combination of block schematic representation and component representation. The net OUT is attached to the output of INV. In part TP, every net is named and every subordinate block and component is named. The nets IN1 and A are primary relative to part X1. The nets IN2 and B are primary to part X2 and the nets A, B, and C are primary to part Y1. The nets C and OUT are primary to part INV. The nets IN1, IN2, and OUT are primary to part TP. The nets A, B, and C are local to part TP.

Figure 2C:
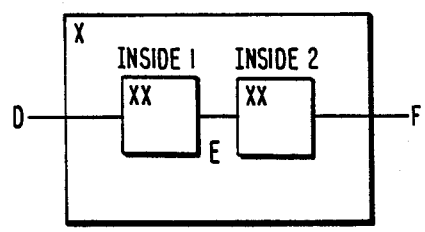

Circuit 30 is then broken down to more subordinate and lower hierarchical levels on the workstation as represented by FIGS. 2c-2f. Every block type X appearing in the top hierarchical level, FIG. 2b, comprises the circuit of FIG. 2c. In FIG. 2c, block type X is a generic block for all type X blocks employed in the next superior block, block TP, FIG. 2b. The name of the type X block of FIG. 2c is assigned in the next superior block as in FIG. 2b. Thus, block X is named X1 and X2 in FIG. 2b.

In FIG. 2c, type X comprises two type XX blocks. Net D is a primary input to the first XX block, named INSIDE1 and its output net is a local net E in block type X. INSIDE1 corresponds to buffer BUF1, FIG. 2a. Net E is an input net to type XX block, named INSIDE2. INSIDE2 has an output net F. Where ever a type X block appears in FIG. 2b, its next lower hierarchical level appears as in FIG. 2c.

Part type XX, INSIDE1, has a specific instance name represented by its full path name TP.X1.INSIDE1, TABLE IB, which distinguishes it from other type XX parts. Similarly, the type XX part INSIDE2 has a specific instance name TP.X1.INSIDE2, and so on. Thus, the full path names serve an important function of identifying each block in a hierarchy.

Figure 2E:
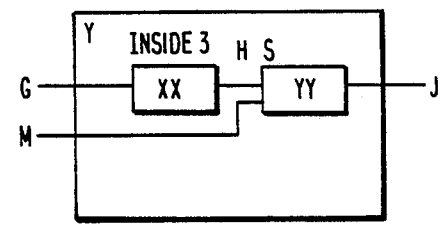

Part Y, FIG. 2e, comprises two blocks, a type XX and a type YY. Type XX is named INSIDE3 to distinguish it from the other type XX parts. INSIDE3 has an input net G and an output net H. Output net H is the input net of type YY block. The type YY block is named S and has an output net J. Type YY part S has a second input net M. There is only one type Y, part Y1, FIG. 2b, in the circuit. Part type XX comprises a buffer type 1300, FIG. 2d, named BUF and has an input net K and an output net L. Part S, FIG. 2f, comprises a type 2AND gate named AND. AND has two input nets Q and N and an output net P.

The information of FIGS. 2b-2f resides in a binary data base 30, FIG. 1. The data base 30, FIG. 1, comprises information about the design, is in binary format and is not readily accessible to a user. A computer program supplied with the workstation accesses certain of the information stored in the binary data base 30. Such a program, represented by compiler 32, creates data files 40. Data files 40 comprises a flat part description 40₁, TABLE IA, and net synonyms in block hierarchical order 40₂, TABLE IB.

TABLE IA

| **Part | Flat Part Description Type | Nets | |
|---|---|---|---|
| X1.INSIDE1.BUF | 1300 | IN1 | *X1.E |
| X1.INSIDE2.BUF | 1300 | *X1.E | A |
| X2.INSIDE1.BUF | 1300 | IN2 | *X2.E |
| X2.INSIDE2.BUF | 1300 | *X2.E | B |
| Y1.INSIDE3.BUF | 1300 | A | *Y1.H |
| Y1.S.AND | 2AND | *Y1.H,B | C |
| INV | IV | C | OUT |

*These are local or internal nets.
**The TOP part name TP is omitted from full path names.

Figure 2D:
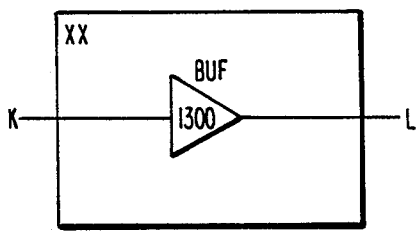
Figure 2F:
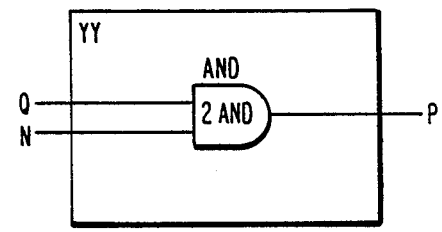

The flat part description, TABLE IA, lists each component with the names of the blocks in which that component lies. In practice, the nets of the flat part net list are listed with their most global names, that is, the name used is the name of that net in the highest level in which that net appears. For example, the input net of each buffer, FIG. 2d, is K. In X1, however, input K is the same net as net IN1, FIG. 2b. TABLE IA lists the input net of the buffer, BUF1, FIG. 2a, of X1 as IN1 rather than K and so on.

TABLE IB

| Block (Full Path Names) | Type | Synonym File Global Nets | Local (L) Primary (P) | Local Nets |
|---|---|---|---|---|
| TP | TOP | IN1 | P | |
| | | IN2 | P | |
| | | A | L | |
| | | B | L | |
| | | C | L | |
| | | OUT | P | |
| TP.X1 | X | IN1 | P | D |
| | | E | L | E |
| | | A | P | F |
| TP.X2 | X | IN2 | P | D |
| | | B | P | F |
| | | E | L | E |
| TP.Y1 | Y | A | P | G |
| | | B | P | M |
| | | C | P | J |
| | | H | L | H |
| TP.X1.INSIDE1 | XX | IN1 | P | K |
| | | E | P | L |
| TP.X1.INSIDE2 | XX | A | P | L |
| | | E | P | K |
| TP.X2.INSIDE1 | XX | IN2 | P | K |
| | | E | P | L |
| TP.X2.INSIDE2 | XX | E | P | K |
| | | B | P | L |
| TP.Y1.INSIDE3 | XX | A | P | K |
| | | H | P | L |
| TP.Y1.S | YY | H | P | Q |
| | | B | P | N |
| | | C | P | P |

The synonym file 40₂, FIG. 1, TABLE IB, includes the synonym names of the nets of blocks but does not include the nets of the components. Input net D, type X FIG. 2c, is a synonym for nets IN1 type TOP, FIG. 2b, E, type XX, FIG. 2c, and G, type Y, FIG. 2e. The output net F, FIG. 2c, is a synonym of nets A and B, FIG. 2b. In FIG. 2e, input net G is a synonym of net A, FIG. 2b, and input net M is a synonym of net B. Output net J is a synonym of net C. In TABLE IB, information is present for all primary and local nets for each block. However, the component nets are not present in this file.

While the nets listed in the synonym file are described as primary or local, it does not identify which nets are input, which nets are output, or which nets are bidirectional. This information is contained only in the component library. What is missing from the files $40_1$ and $40_2$ is the functional description of the block primary nets. The present invention recognizes that the full path names of all blocks of the synonym file and of the components of the flat part description file implicitly contain hierarchical coupling when rearranged as described below into a format useful for net list extraction. It is to be understood that the schematic capture 10 and the resulting binary data base 30, and drawing compiler 32 are commercially available, for example, in a Valid Logic Corporation workstation. But, most important, the resulting files 40 are insufficient to derive a hierarchical net list.

TABLE II illustrates a hierarchical net list for the circuit of FIG. 2b, can be reproduced by the workstation on its display, and printed as hard copy, if desired, when the workstation is modified as described hereinbelow according to the present invention.

TABLE II

Hierarchical Net List

| | | | |
|---|---|---|---|
| Type = TOP | I = IN1,IN2 | | O = OUT |
| Part = X1 | T = X | I = IN1 | O = A |
| Part = X2 | T = X | I = IN2 | O = B |
| Part = Y1 | T = Y | I = A,B | O = C |
| Part = INV | T = IV | I = C | O = OUT |
| Type = X | I = IN1 | | O = A |
| Part = INSIDE1 | T = XX | I = IN1 | O = E |
| Part = INSIDE2 | T = XX | I = E | O = A |
| Type = XX | I = IN1 | | O = E |
| Part = BUF | T = 1300 | I = IN1 | O = E |
| Type = Y | I = A,B | | O = C |
| Part = INSIDE3 | T = XX | I = A | O = H |
| Part = S | T = YY | I = H,B | O = C |
| Type = YY | I = H,B | | O = C |
| Part = AND | T = 2AND | I = H,B | O = C |

In TABLE II, the word "Type" heads the definition of a block, "Part" refers to the instance name, "T" refers to its type, "I" is a primary input net, and "O" is a primary output net. No bidirectional nets are shown but in practice would be included. The hierarchical net list starts from the top block, lists its type, its inputs (I), and its outputs (O) by name. Immediately following the TOP block is a list of the parts forming that block. Following the TOP block description is a list of each of the subordinate blocks, their parts, and nets. The list requires the names of the input, output, and bidirectional nets (not shown) at each level of the hierarchy including components. The net list is self-explanatory. This list contains all the information necessary for logic simulation and proper component layout and net routing.

In accordance with the system of the present invention, the information needed to create the hierarchical net list of TABLE II includes:

TABLE III (1) type name, for each block
(2) names of the primary nets for this block,
(3) which nets are input, output, or

TABLE III-continued bidirectional for this block,
(4) for each block which is a subordinate of a block named in item (1) above,
  (a) the type of the subordinate block,
  (b) the names of the primary nets which correspond to this subordinate block,
  (c) which of these primary nets are input, output, or bidirectional, and
(5) components which appear in the block named in item (1) above, including:
  (a) the type of component,
  (b) the net names of that component, and
  (c) which nets are input, output, or bidirectional.

Figure 4:
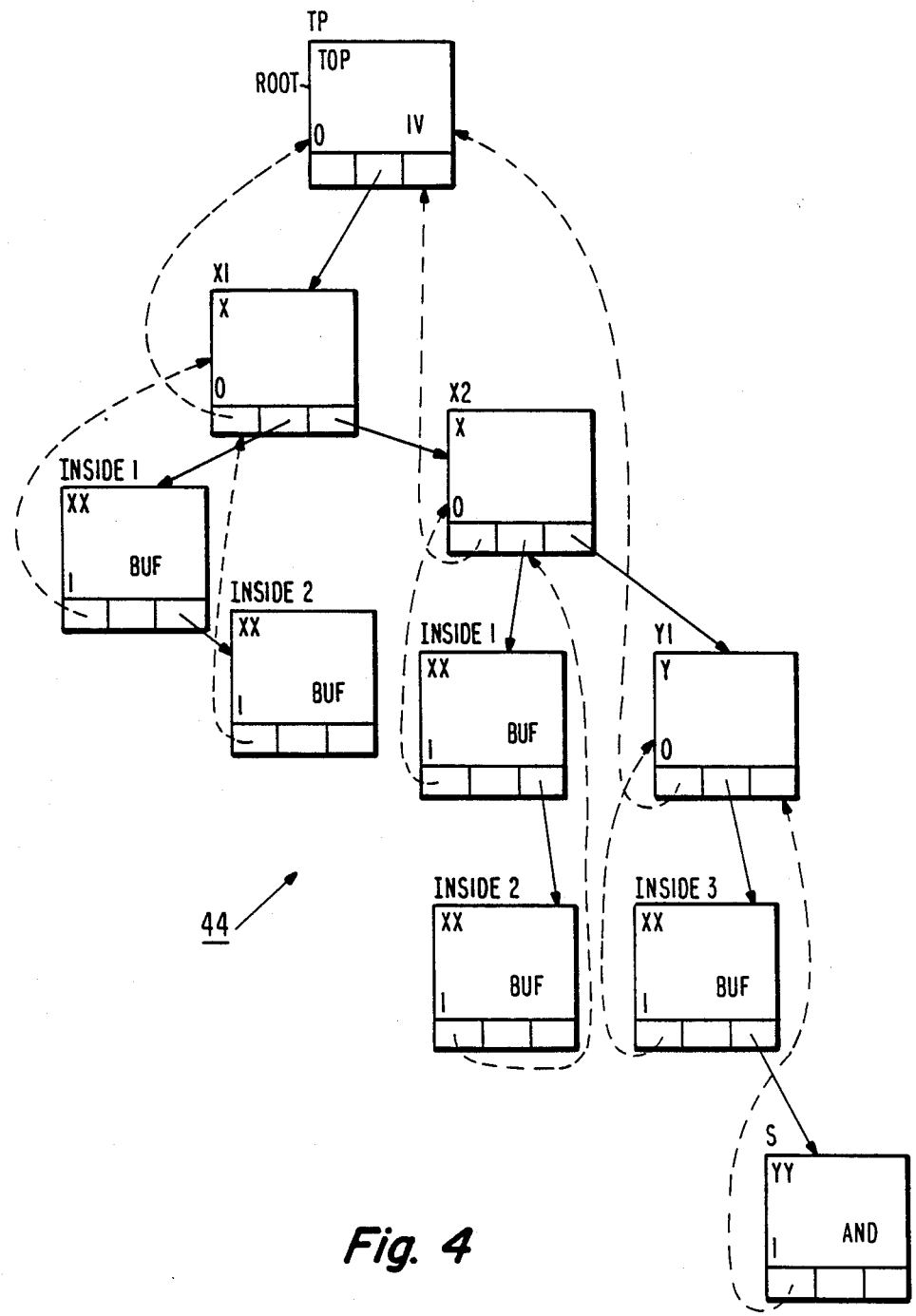
FIG. 4 is a binary tree representation of records for the data of FIGS. 2a-2f created by functional block 53 of FIG. 3.

The significance of the hierarchical net list is that all primary nets are functionally described and the functional relationship of all subordinate blocks and their parts and nets are set forth. The information of TABLE III required to create a hierarchical net list, TABLE II, is derived from the component library 13 and the data files 40, FIG. 1, by net list extractor 42. Extractor 42 re-forms the information of data files 40 and the library 13 into binary tree format, FIG. 4, and inserts in each tree record the desired information, as described below. The records of the tree are then processed so they comprise all of the information needed to extract a hierarchical net list. The binary tree format, FIG. 4, is utilized rather than that of a standard tree in the interest of memory utilization efficiency, as is well known.

In a given hierarchy, a parent may have any number of children. For example, in FIG. 2b, if block TP is the parent, it has three children, parts X1, X2, and Y1. Part INV is a component, and is not a child in the present context. In a binary tree, however, each record has, at most, two children. That record is referred to as the parent. One child is referred to as the first son and the other child is referred to as the next brother. The next brother may also have a next brother and so on for each child of the parent. In FIG. 2b, TP is the parent, for example, X1 is the first son, X2 is the next brother, and Y1 is the next brother of X2. In the present implementation, because components are not children, they are not described in separate records, but are described in a block record as will be explained. The parent, next brother, and first son pointers are assigned each record as the tree is created which will be described in more detail below.

Figure 3:
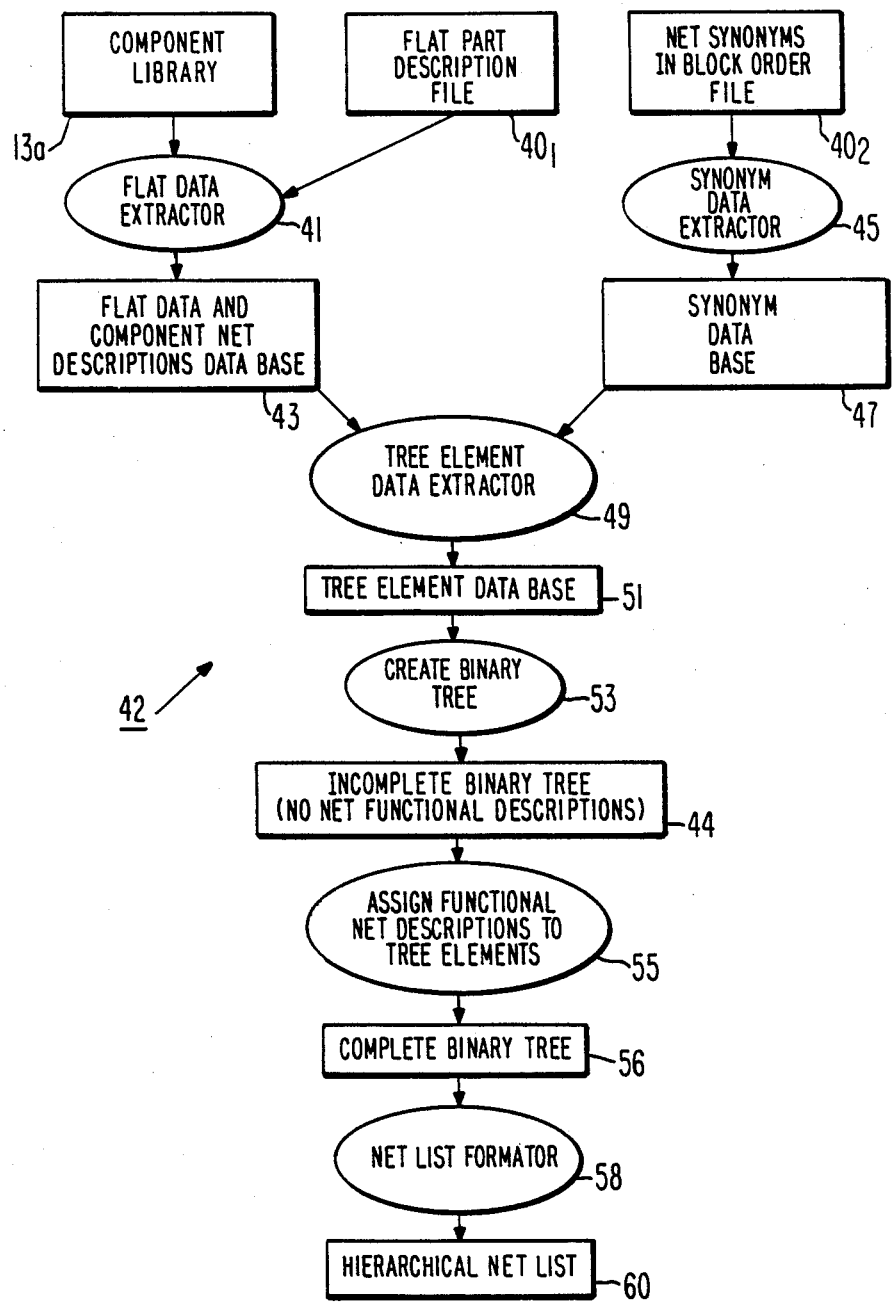
FIG. 3 is a flowchart illustrating the hierarchical net list extraction functional block 42 of FIG. 1.

Extractor 42, FIG. 1, creates hierarchical part net records from the flat part description file $40_1$ (TABLE IA), net synonyms file $40_2$ (TABLE IB) and the component library 13a and forms that data into a binary tree 44, FIG. 3. The net list extractor 42, FIG. 1, derives the hierarchical net list, TABLE II, from the records of the complete tree 56, FIG. 3. The integrated circuit fabrication system 48, FIG. 1, derives the necessary data from the hierarchical net list to create the software and data bases necessary for fabrication of the integrated circuit on a silicon wafer. System 48 is commercially available.

In FIG. 3, flat data extractor 41 extracts flat data and component description data base 43, which resides in computer memory, from library 13a and flat part description file $40_1$. Data base 43 includes all of the flat data and the net functional description for all component nets, i.e., whether the nets are input, output, or bidirectional. Synonym data extractor 45 extracts a synonym data base 47 from the net synonym file $40_2$. The synonym data base 47 includes all net synonyms and the full path names of all blocks and resides in computer memory. Tree element extractor 49 is a computer program which searches data bases 43 and 47 to create in computer memory the tree element data base 51. Data base 51 contains all of the information necessary to create a binary tree 44 at 53.

The binary tree 44, FIG. 4, represents the hierarchical order of the various circuit blocks of the circuit 12, FIG. 2a, depicted in FIGS. 2b-2f. The tree 44 TOP record part TP is the root and includes a component part IV. Part TP has as its first son part X1, FIG. 2b. Since each record, in this case TOP block part TP, can have only one first son, the remaining blocks, parts X2 and Y1 are next brothers. The order of assignment as to which block is the first son of part TP is arbitrary. Part X1 has a next brother, part X2. Block Y1 is a next brother of part X2. Part TP.X1.INSIDE1 (the full path name is the instance name for this part, hereinafter X1.INSIDE1) is the first son of part X1 and is a type XX, FIG. 2c. X1.INSIDE1 has a next brother X1.INSIDE2. There are no more parts in type X, FIG. 2c, and, therefore, part X1.INSIDE2 has no next brother. Part X1.INSIDE1 has a component, a type 1300 buffer BUF. In a type XX block, there are no more components. There are no more blocks subordinate to type XX, and, therefore, type XX has no sons. Part X1.INSIDE2 has a component, a type 1300 buffer, BUF which also has no sons or next brothers.

The next brother of part X1 is part X2. Part X2 has a first son part X2.INSIDE1. Part X2.INSIDE1 has one component, a type 1300 buffer BUF, has no sons and one next brother X2.INSIDE2, which is a type XX, has no other brothers and no sons. The next brother of X2 is Y1 which has a first son INSIDE3. INSIDE3 has a component type 1300 buffer BUF. Part INSIDE3 has no sons. The next brother of INSIDE3 is part S type YY, FIG. 2e. Part S has a component part AND, a type 2AND gate. Part S has no sons and no other brothers. Y1 has no next brothers. The procedure to create the tree 4 and the particular information contained in each record of the tree is important and how that information is assigned will be described in more detail below.

Figure 5:
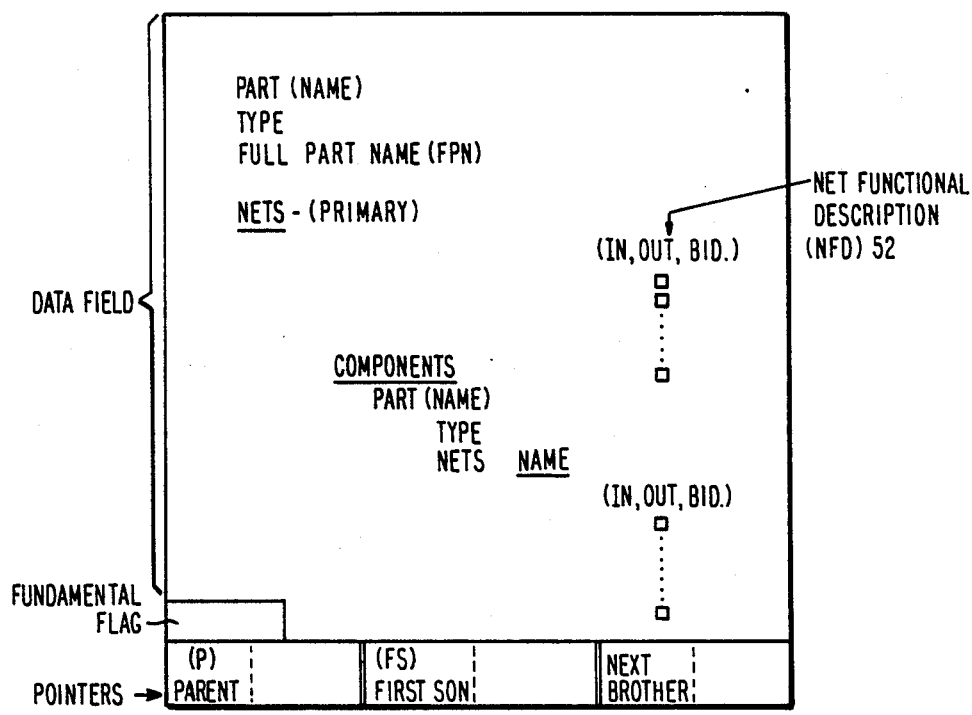
FIG. 5 is a more detailed description of each record of the binary tree of FIG. 3.

In FIG. 5, a typical binary tree record includes a fundamental flag field, a data field and a pointer field. The information in the data field includes the part name for a given block, its type, its full path name, the primary nets of that part, including their names, a net functional description (NFD) field for each so-named net, that is, whether it is an input, an output, or a bidirectional net, and the components of that part, their type, and the component nets by name and their net functional description. The fundamental flag field except for the leaves of the tree, e.g., X1.INSIDE1, X1.INSIDE2, and so forth, indicates whether or not all primary nets and component nets named in the record have all nets functioally described as input, output, or bidirectional. When all nets are so described, the fundamental flag is encoded with a first code, for example, a binary 1. If any of the primary nets of a given record, except for the leaves, are not fully functionally described in that record, the fundamental flag is encoded with a second different code, for example, a binary 0, which flags that record as being not fundamental. In contrast, all leaves are encoded fundamental.

The net functional description for all component nets are known from the component library and is supplied to the data base 51 by extractor 49, FIG. 3. This information is immediately inserted into each component of each element of tree 44 as the element is created. However, whether or not the primary nets of the blocks at the different levels are input, output, or bidirectional is not known from data base 51. Further, immediate information is also not known from the synonym data base 47 and flat data base 43 in creating the tree as to which tree elements are the parent, first son, and next brother. The parent, first son, and next brother pointers of each record needs to be assigned so that the data fields incorporating all net functional descriptions of the primary nets can then be set forth in each record.

A computer program at step 53, FIG. 3, searches data base 51 to create tree elements wherein each tree element forms a separate record. The information available from data base 51 for creating the root, element 50 FIG. 6, part TP, includes the part name, TP, its type, TOP, its full path name (TP) and the primary net names IN1, IN2, and OUT. However, the information in data base 51, FIG. 3, does not include whether these primary nets are input, output, or bidirectional. It does include the net functional description (NFD) for each component, in this case, component INV. The nets of INV, FIG. 2b, are C=input and OUT=output.

Figure 6:
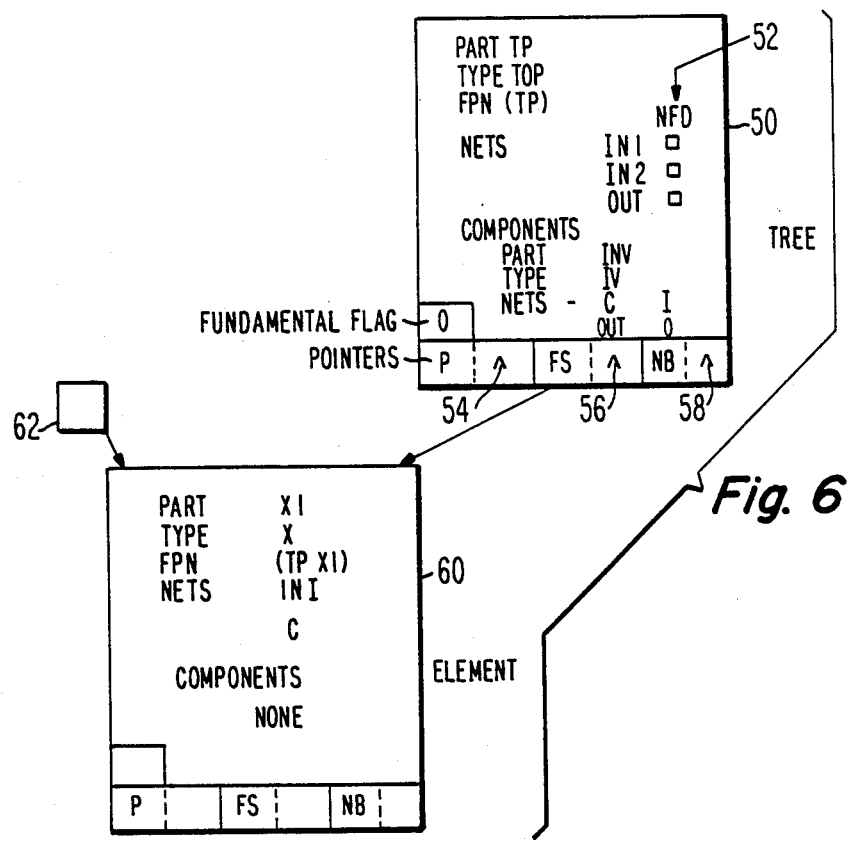
FIGS. 6 and 7 are diagrams useful in explaining the creation of the binary tree of FIG. 3 at functional block 53 of FIG. 3.

To create a tree, step 53, the net functional description (NFD) of the primary nets data fields 52, FIG. 6, of element 50 are initially set as input in each tree element, except for the components. In the alternative, the field 52 for the primary nets of TP could all be set input later in the algorithm of TABLE IV. Included in the data field of element 50 is a listing of all components that appear in that block. For example, in FIG. 2b, type TOP includes one component type IV (INV) which is listed in the record for TOP. The information as to whether the component nets are input, output, or bidirectional is inserted at step 53 into element 50, FIG. 6, for each component appearing in that element, only one component, IV, in this case. The fundamental flag of element 50 is initially set binary 1. Parent pointer P of element 50 is set null, represented by symbol 54. The first son pointer is set null, represented by symbol 56 and the next brother pointer is set null, represented by symbol 58. The information of element 50 as just described becomes the tree at this time and is a record. It is to be understood that to write a computer program (not shown) to create a binary tree, step 53, is within the skill of one of ordinary skill in the computer science art as shown, for example, in *Fundamentals of Data Structures;* by Horowitz and Sahni; Computer Science Press; 1983; Rockville, Md.

Element 50, FIG. 6, is the first tree record, and the data base 51, FIG. 3, is searched for the next tree element. The data base 51 is searched for full path names. Upon reaching a full path name of an element, e.g., element 60, the instance name of the particular part of that element reached is deleted from the full path name and a right parenthesis is substituted in its place to create a parent search string. For example, assume element 60 is part X1. The full path name of part X1, element 60, is (TP X1). The instance name X1 of part X1 is deleted from its full path name, and the right parenthesis is moved to the space of the deleted name X1. This creates a search string (TP) which is compared with the full path name of each element in the data base 51. The search string (TP) so formed matches the full path name of the next superior block, part TP, element 50 of the tree. Element 60 thus forms the next record of the tree. In FIG. 6, a pointer 62 points to the next element found, e.g., element 60.

Figure 7:
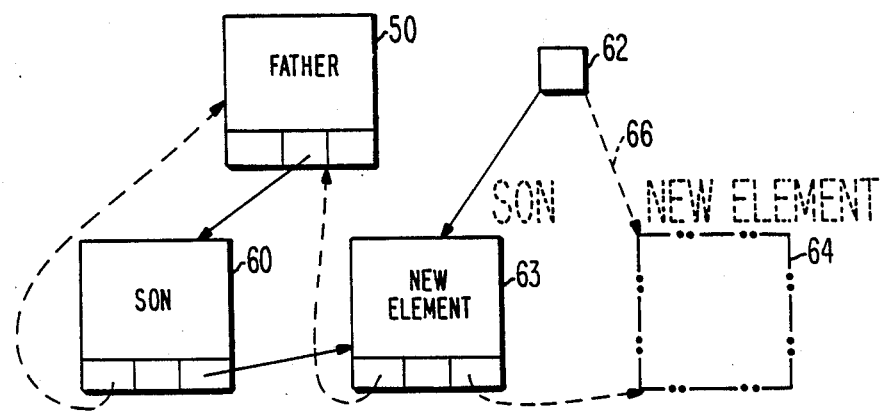

In FIG. 4, each brother of part X1 has the same parent search string which matches the full path name of part TP. It does not matter which of the brothers is reached first in the search. Upon comparing the search string with the full path name of element 50 and finding that these match, the first son pointer of element 50, FIG. 6, is pointed to the element 60 by transferring the pointer address of pointer 62 to the first son pointer of element 50. Once an element is assigned an address in its first son pointer, its fundamental flag is reset to 0. The flag of element 50 is now 0. Since element 60 is the son of element 50, the parent pointer of element 60 is assigned the address of element 50. Because record 50 is a type TOP which is the root element of the tree, the next brother pointer null status, symbol 58, is not changed. At this point, the parent pointer of element 60 is pointing to record 50 but the first son and next brother pointers of element 60 are null. The full path names of all elements are searched as described above to see if they are a son of element 50. If such an element, e.g., element 63, FIG. 7, is found, the next brother pointer of the last element reached, element 60, is searched. The element 60 next brother pointer is checked to see if it is null. If it is null, it is pointed to the new element 63, FIG. 7, which is also pointed to by pointer 62 which automatically is assigned the address of the newly found element 63 as a "son."

Because the new element 63 is now redefined as son by pointer 62, the parent field of the new element 63 is assigned the address of record 50, its father. The new element 63 is pointed to by the element 60 next brother pointer and the parent pointer of element 63 points to record 50 in its parent pointer, and is now part of the tree.

The program now redefines the new element 63 as a "son" and searches data base 51 for a new element and finds element 64, shown in phantom, whose full modified path name, as described above, corresponds to the part name of the parent element 50. Pointer 62 points at 66 to the address of the new element 64. The next brother pointer of the now redefined son element 63 is pointed to element 64. The element 64 parent pointer is then assigned the location of element 50. In this way each record is linked up to the tree, one at a time, based upon the full path name search string created for that new element. Assuming X1, X2, and Y1 are linked, a new element representing X1.INSIDE1, FIG. 4, is found whose parent is X1. X1 is assigned the address of X1.INSIDE1 in its first son pointer and X1.INSIDE1 is assigned the address of X1 as its parent in its parent pointer. The above process is repeated until all parent, first son and next brother pointers are set, where applicable, for each element in the file. The program, step 53, does this until at least all parent pointers are assigned for all elements (some elements have no sons or next brothers, e.g., part S) and no more sons are found in data base 51.

The process includes resetting the fundamental flag to zero for each element assigned a first son address. Only the leaves of the tree, e.g., X1.INSIDE1, X1.INSIDE2, and so forth, FIG. 4, have no first sons. If no first son is assigned, the fundamental flag remains a binary 1, previously set and indicates that that element is fundamental. This is important because it identifies each element which has a first son as not being fundamental. (At this point all elements of the tree are records and the tree is formed.) The blocks including leaves may comprise blocks and components and, by definition, the primary nets of a block, whether or not it includes a component, are undefined at this point. The above process thus creates an incomplete binary tree 44, FIGS. 3 and 4, in which the block primary nets are not functionally described. However, recall that all such primary nets are assigned the input function as soon as each record is created in the tree.

The next step 55 in the process, FIG. 3, is to assign the net functional description (NFD) to each record. The approach of the methodology in assigning the net functional descriptions to each record in the tree of FIG. 4 employs a recursive algorithm expressed in quasi-pascal in TABLES IV, V, and VI.

TABLE IV

| | Assign_IO (tree) |
|---|---|
| (i) | If tree is not fundamental |
| | Then begin |
| (ii) | Son = tree's 1st son |
| | while there is still a son |
| | Begin |
| (iii) (iii') | Assign_IO (son) |
| *(a) | Assign nets of son to tree |
| | Son = son's next brother |
| | End |
| | End |
| *(b) | Assign nets of each component of tree |
| | to tree |
| (iv) | Set tree as fundamental. |
| | End |
| © 1985 RCA Corp. | |

*Step iii' is recursive.
Steps (iiia) and (iiib) of TABLE IV are shown in more detail in TABLES V and VI, respectively.

TABLE V

Step iiia

Begin
  While tree input nets not nil
    Begin
      Change son out nets to out on same net of tree
        Output nets done when son out nets are nil
      Change son bidirectional nets to bidirectional
      on same net of tree
        Bidirectional nets done when son bidirectional
        nets are nil
    End
End
© 1985 RCA Corp.

TABLE VI

Step iiib

Begin
  While parts not nil
    Begin
      While tree input nets not nil
        Begin
          If this part has any output nets with the
          same name as this net then change this net
          to output
        Begin
          If this part has any bidirectional nets with
          the same name as this net then change this
          net to output
        End
      End
    End
End
© 1985 RCA Corp.

The algorithm of TABLE IV employs the fundamental flags of the records to identify those records which are not fundamental and, therefore, identify those records whose nets need to be fully described. After a record's primary nets are fully described, its fundamental flag is reset to 1. Employing the hierarchical links of the first son, parent, and next brother pointers, the tree is traversed using the fundamental flags as stopping point keys, step (i) TABLE V. In TABLES IV, V, and VI, "tree" refers to a record.

In TABLE IV, starting at the TOP record of the tree, FIG. 4, the fundamental flag is first checked. If it is not fundamental, then the next son is traversed. For example, X1 is the son of TOP. TOP is not fundamental and the process goes to the son of TOP, X1. In step iii', assign IO means in this case to perform the algorithm of TABLE IV to X1. What this means is that the program returns to the beginning (step i) and X1 now is the "tree." When all of the steps of TABLE IV are done while tree is X1, the algorithm returns to step iii with tree being TOP. If the tree is not fundamental, the program will repeat for each son of X1. In this case X1 is not fundamental, therefore, its sons will be traversed. By way of further example, INSIDE1 is the son of X1. Step iii will call the algorithm over again for INSIDE1, i.e., INSIDE1 is now "tree." INSIDE1 is fundamental. The program now goes to step iiib, TABLE VI. The net descriptions of the components of INSIDE1, namely BUF, is assigned to the primary nets of INSIDE1. The output net of BUF is the output net E of INSIDE1 (in the tree record the output net of BUF is labelled E rather than L because it is given the most global name). The program at this point scans the input nets of INSIDE1 and discovers the occurrence of net E. Therefore, net E is assigned the (NFD) description "output." Step iiib continues for all components of INSIDE1 but in this case there is only one component. At this point step iv sets the flag of INSIDE1 fundamental at binary 1 (it is already a binary 1 because of the procedure in setting up the tree).

The program returns to the algorithm step iii when X1 was the tree. Step iiia assigns the NFD of the nets of INSIDE1 to X1 (similarly as done from the components to the primary nets of X1.INSIDE1). The son is now INSIDE2, the next brother of INSIDE1, and the process repeats with INSIDE2 being the tree, returning to step iii (there are still sons). Step iii assigns the nets of INSIDE2 to X1 as it did for INSIDE1. In step iiia, the nets of INSIDE2 get assigned to the primary nets (if any) of X1. There are no more sons, the iteration returns to step iiib. There are no components in X1 and step iv is completed which assigns X1 fundamental. Step iiia is returned to where the tree is TOP. In step iiia the nets of X1 get assigned to TOP. The next brother of X1, X2, is perused and since there are still sons, step iii is processed. The algorithm repeats for X2 similarly as described above for X1. Eventually the nets of X2 get assigned to TOP and the same process repeats for Y1. When there are no more sons, step iiib is processed which requires the component nets, INV, be assigned to the primary nets of TOP. Then, the tree TOP is flagged fundamental and the entire algorithm is completed. Step iii requires the output and bidirectional nets of son X1 to be assigned to the "tree," which is TOP. This is done at step (iiia), TABLE V. In TABLE V as long as the tree has an input net (all primary nets are initially set "input"), each tree net is made output or bidirectional if a net of the same name is found in the son.

Once having completed all information in each record of the tree to form a complete binary tree 56, FIG. 3, the hierarchical part net list, TABLE II, can be derived by the net list formator 58. The net list formator 58 extracts the hierarchical net list from the completed tree utilizing a computer program which searches the tree for the information of TABLE II and lists the information as depicted in TABLE II. This information forms the net list 60. The list 60 is utilized by the integrated circuit fabrication software 48, FIG. 1, in a well-known process for completion of the cycle.

Utilizing the techniques employed herein for creating the hierarchical net list information with the net list extractor 42, FIG. 1, a critical link is established between commercially available workstations comprising elements 10, 11, 13, 30, 32, and 48.

What is claimed is:

1. In a system for deriving a hierarchical net list from a data base comprising: (a) an output flat part description file of an integrated circuit comprised of numerous components each component in the integrated circuit being described by a full path name; (b) an output synonym file comprised of entries corresponding to blocks representing said integrated circuit, each block being described by a type name, a full path name, primary and local nets where the primary nets describe the interconnections of a block to other blocks external to that block, and the local nets describe the interconnections within a block; and (c) a component library containing a functional description of all component nets indicating which are input, output, or bidirectional nets for each component in said files, the system comprising:

first means for deriving from said output flat part description file, said output synonym file and said component library a plurality of records each at a given unique address in a computer memory, each record containing information as to each different block or part including its name and its type, its full path name describing its place in a given hierarchy of that circuit, the names of its primary nets, the names and types of its components, if any, and the functional description of each component net;

second means for deriving from said full path name of each said block a hierarchical coupling of that block record to its next of kin in the hierarchy and for assigning each record a memory address pointer pointing to selected ones of said next of kin; and means responsive to said first and second means for providing a net functional description of all primary nets in each said record to thereby provide records from which a hierarchical net description for each block and part in the circuit can be derived.

2. The system of claim 1 further including means for deriving said hierarchical net list from said hierarchical records.

3. The system of claim 1 wherein said means for deriving the hierarchical coupling includes means for forming said records into a binary tree wherein each record has no more than one son and no more than one brother.

4. The system of claim 1 wherein said means for deriving the hierarchical coupling includes means for assigning a given record parent status relative to a second record in which the full path name of the parent record is the full path name of the child record less the name of that child and means for pointing the child record to the parent and vice versa in their respective child-parent pointing fields, and means for assigning brother status to each first child record of a given parent record in which the brother full path name is the same as that of the first child's parent less the brother's name and the child pointer of the parent is assigned, and iterating the above until all next of kin pointers of each record having said next of kin is assigned.

5. The system of claim 1 wherein the means for providing the net description includes means for flagging each record with a first flag when all primary nets of that record are described or fundamental and a second flag when all primary nets of that record are not described or that record is not fundamental, and means for providing the net functional description of the primary nets of each record by correlating the names of each net of each component of that record with the names of the primary nets of that record, assigning the net functional description of each component net, where applicable, so correlated to the primary net of that record with that name, and flagging each record with the first flag when all children's records of that record have been correlated and their primary nets assigned.

6. In a method for deriving a hierarchical net list from a data base comprising: (a) a flat part description file of an integrated circuit including numerous components each component in the circuit being described by a full path name, (b) an output synonym file comprising entries corresponding to blocks representing said integrated circuit, each block being described by primary nets having names and by a full path name; and (c) a component library containing a functional description of all component nets indicating which are input, output, or bidirectional nets for each component in said files, the steps comprising:
    deriving from said output files a plurality of records each at a given unique address in a computer memory, each record containing information as to each different block or part including its type, its full path name describing its place in a given hierarchy of that circuit, the names of its primary nets, the names and type of its components and the functional description of each component net;
    deriving from the full path name of each said block a hierarchical coupling of that block record to its next of kin in the hierarchy and for assigning each record a memory address pointer pointing to selected ones of said next of kin; and
    providing the net functional description of all primary nets in each said record to thereby provide a hierarchical net description for each block and part in the circuit.

7. The method of claim 6 further including the step of deriving said hierarchical net list from said records.

8. The method of claim 6 wherein deriving from the full path name of each said block a hierarchical coupling of that block record includes coupling said records in a binary tree arrangement wherein each record can have at most one child and one brother.

9. A method of creating hierarchical records of an integrated circuit comprising:
    storing in a first section of a computer memory a first file comprising a flat part description of the integrated circuit comprised of numerous components, each component in the integrated circuit being described by a full path name and by primary nets having names;
    storing in a second section of the computer memory a second file comprising a synonym data base including entries corresponding to blocks representing said integrated circuit, each block being described by a full path name and by primary and local nets having names;
    storing in a file a component library containing for components of said integrated circuit their net names and a net functional description indicating which nets are input, output, or bidirectional; and
    creating in a third section of the computer memory a plurality of records wherein each record contains information pertaining to a given circuit block, its circuit type, full path name, primary net names, the functional description of each primary net, and a list of components, if any, for that block, including the names of the nets of all such components and their functional description, each such record being hierarchically related to at least one other record, each such record containing a plurality of pointer memories, one of such pointer memories containing the address of its parent, if any, a second of such pointer memories containing the address of its first son, if any, and a third of said pointer memories containing the address of a next brother, if any.

10. The method of claim 9 further comprising the method of accessing said records utilizing the next of kin pointer addresses of each record for deriving a hierarchical net list for said circuit in which all blocks and components are listed with their nets functionally described.

11. The method of claim 9 wherein said step of creating said records includes creating an incomplete binary tree by creating a tree element data base, establishing a search string in a computer memory comprising the full path name of a record then being created less the name of this record, searching all records in the tree element data base for the name corresponding to the name in the search string, checking the first son pointer of the found record, and if null, pointing the found record first son pointer to this record and pointing this record's parent pointer to the found record; if the first son pointer is not null, checking the next brother pointer of the found record, and if null, pointing the found record next brother pointer to this record, and pointing this record's parent pointer to the parent of the found record; and if the found record's next brother pointer is not null, checking the next brother pointer of the next brother of the found record, repeating the above iteration until a next brother pointer of a record is found null and inserting in the parent pointer of this record the address of the parent, and the address of this record in the next brother pointer of the last found record, and then repeating this iteration until all records point to a parent.

12. The method of claim 9 wherein the step of creating said records includes the steps of:
    (1) creating a binary tree of said records;
    (2) starting at the top of the hierarchy of the tree, assume all primary nets as inputs for all records and functionally describe all nets of all components in all records;
    (3) for all records in which primary nets are assumed inputs, except for leaves, flagging the records as not fundamental;
    (4) for all leaf records and all records in which all nets become described, flagging such records as fundamental;
    (5) tracing through the hierarchy and identifying synonym nets for such described primary nets in the next superior record and enter the description of such identified nets in that next superior record;
(6) for all components in each record whose nets are synonyms of the primary nets of that record, describing the primary nets of that record accordingly;
(7) flagging as fundamental that record whose primary nets become fully described; and
(8) repeating steps 5-7 in the hierarchy until all records have their nets fully described and are flagged as fundamental.

13. A system for deriving hierarchical records describing an integrated circuit containing a plurality of hierarchical related blocks from a flat part description file, a net synonym file and a component library; said system comprising:
first means for forming a synonym data base from said synonym file;
second means for forming a flat data and component net description data base from said flat part description file and said component library; and
means responsive to said first and second means for creating a tree from said synonym data base and said flat data and component net description data base containing a plurality of records, each record containing for each said block of the integrated circuit a full path name, its type, its primary nets and their functional description and all components and their nets and their net functional description.

14. The system of claim 13 wherein said means for creating a tree include means for deriving a tree element data base from said files and library, said tree element data base containing the full path names of all said blocks and components, the names of the nets of each said block, and the net functional description of the component nets of all components and nets for deriving from said tree element data base a binary tree in which each tree element is a different block record of the circuit containing the functional description of all primary nets of each said different block.

15. In a system for deriving a hierarchical net list from a data base comprising an output flat part description file of an integrated circuit including the full path name of each component in the circuit, an output synonym file containing the names of the primary nets of each block for all nets in the circuit and the full path name of each block in the circuit; and from a component library containing the functional description of all component nets indicating which are input, output, or bidirectional nets for each component in said files, the combination comprising:
means for deriving from said output files and library a plurality of records each at a given unique address in a computer memory, each record containing information including the name of a different block or part and its type, its full path name describing its place in a given hierarchy of that circuit, the names of its primary nets, the names and types of its components, if any, and the functional description of each component net;
means for deriving from said full path name of each said block the hierarchical coupling of that block record to its next of kin in the hierarchy and for assigning each record a memory address pointer pointing to selected ones of said next of kin;
means for providing the net functional description of all primary nets in each said record to thereby provide records from which a hierarchical net description for each block and part in the circuit can be derived; and
wherein said means for deriving the hierarchical coupling includes means for assigning a given record parent status relative to a second record in which the full path name of the parent record is the full path name of the child record less the name of that child and means for pointing the child record to the parent and vice versa in their respective child-parent pointing fields, and means for assigning brother status to each first child record of a given parent record in which the brother full path name is the same as that of the first child's parent less the brother's name and the child pointer of the parent is assigned, and iterating the above until all next of kin pointers of each record having said next of kin is assigned.

16. A method of creating hierarchical records of an integrated circuit comprising:
storing in a first section of a computer memory a first file comprising a flat part description of the circuit including the full path name of each component in the circuit and the names of the primary nets of each said component;
storing in a second section of the computer memory a second file comprising a synonym data base including the full path names of all circuit blocks and the names of the primary and local nets of each block;
storing in a file a component library containing the net names of each component and the net functional description indicating which are input, output, or bidirectional nets;
creating in a third section of the computer memory a plurality of records wherein each record contains information pertaining to a given circuit block, its circuit type, full path name, primary net names, the functional description of each primary net, and a list of components, if any, for that block, including the names of the nets of all such components and their functional description, each such record being hierarchically related to at least one other record, each such record containing a plurality of pointer memories, one of such pointer memories containing the address of its parent, if any, a second of such pointer memories containing the address of its first son, if any, and a third of said pointer memories containing the address of a next brother, if any; and
wherein said step of creating said records includes creating an incomplete binary tree by creating a tree element data base, establishing a search string in a computer memory comprising the full path name of a record then being created less the name of this record, searching all records in the tree element data base for the name corresponding to the name in the search string, checking the first son pointer of the found record, and if null, pointing the found record first son pointer to this record and pointing this record's parent pointer to the found record; if the first son pointer is not null, checking the next brother pointer of the found record, and if null, pointing the found record next brother pointer to this record, and pointing this record's parent pointer to the parent of the found record; and if the found record's next brother pointer is not null, checking the next brother pointer of the next brother of the found record, repeating the above iteration until a next brother pointer of a record is found null and inserting in the parent pointer of this record the address of the parent, and the address of this record in the next brother pointer of the last found record, and then repeating this iteration until all records point to a parent.

17. A method of creating hierarchical records of an integrated circuit comprising:

storing in a first section of a computer memory a first file comprising a flat part description of the circuit including the full path name of each component in the circuit and the names of the primary nets of each said component;

storing in a second section of the computer memory a second file comprising a synonym data base including the full path names of all circuit blocks and the names of the primary and local nets of each block;

storing in a file a component library containing the net names of each component and the net functional description indicating which are input, output, or bidirectional nets;

creating in a third section of the computer memory a plurality of records wherein each record contains information pertaining to a given circuit block, its circuit type, full path name, primary net names, the functional description of each primary net, and a list of components, if any, for that block, including the names of the nets of all such components and their functional description, each such record being hierarchically related to at least one other record, each such record containing a plurality of pointer memories, one of such pointer memories containing the address of its parent, if any, a second of such pointer memories containing the address of its first son, if any, and a third of said pointer memories containing the address of a next brother, if any; and wherein the step of creating said records includes the steps of:

(1) creating a binary tree of said records;

(2) starting at the top of the hierarchy of the tree, assume all primary nets as inputs for all records and functionally describe all nets of all components in all records;

(3) for all records in which primary nets are assumed inputs, except for leaves, flagging the records as not fundamental;

(4) for all leaf records and all records in which all nets become described, flagging such records as fundamental;

(5) tracing through the hierarchy and identifying synonym nets for such described primary nets in the next superior record and enter the description of such identified nets in that next superior record;

(6) for all components in each record whose nets are synonyms of the primary nets of that record, describing the primary nets of that record accordingly;

(7) flagging as fundamental that record whose primary nets become fully described; and (8) repeating steps 5-7 in the hierarchy until all records have their nets fully described and are flagged as fundamental.

* * * * *